(12) United States Patent
Cheng et al.

(10) Patent No.: US 11,621,400 B2
(45) Date of Patent: Apr. 4, 2023

(54) TRANSPARENT SUBSTRATE, FLEXIBLE DISPLAY SUBSTRATE AND ITS MANUFACTURING METHOD, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Rui Cheng, Beijing (CN); Yuehua Cui, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 126 days.

(21) Appl. No.: 17/212,315

(22) Filed: Mar. 25, 2021

(65) Prior Publication Data

US 2021/0367171 A1 Nov. 25, 2021

(30) Foreign Application Priority Data

May 25, 2020 (CN) .......................... 202010447831.9

(51) Int. Cl.
| | |
|---|---|
| *H10K 77/10* | (2023.01) |
| *H01L 27/15* | (2006.01) |
| *H10K 59/12* | (2023.01) |
| *H10K 71/80* | (2023.01) |
| *H01L 51/00* | (2006.01) |
| *H01L 27/32* | (2006.01) |

(52) U.S. Cl.
CPC ........ *H01L 51/0097* (2013.01); *H01L 27/156* (2013.01); *H01L 27/3244* (2013.01); *H01L 2227/323* (2013.01); *H01L 2227/326* (2013.01)

(58) Field of Classification Search
None
See application file for complete search history.

(56) References Cited

U.S. PATENT DOCUMENTS

| | | | | |
|---|---|---|---|---|
| 2018/0130966 | A1* | 5/2018 | Yun | ................... G09F 9/301 |
| 2021/0296412 | A1* | 9/2021 | Liu | ................. H01L 27/3244 |
| 2021/0376302 | A1* | 12/2021 | Tanaka | ............... H01L 51/0097 |

OTHER PUBLICATIONS

Definition of coincide downloaded from URL<https://www.merriam-webster.com/dictionary/coincide> on Sep. 21, 2022. (Year: 2022).*

* cited by examiner

*Primary Examiner* — J. E. Schoenholtz
(74) *Attorney, Agent, or Firm* — Brooks Kushman P.C.

(57) ABSTRACT

The present disclosure provides a transparent substrate, a flexible display substrate and its manufacturing method, and a display device. The transparent substrate serves as a support substrate for manufacturing the flexible display substrate. The transparent substrate is provided with a first surface for supporting the flexible display substrate, and a protrusion made of a transparent material is formed on the first surface. According to the present disclosure, it is able to adjust a shape of a flexible base substrate of the flexible display substrate through the protrusion.

12 Claims, 3 Drawing Sheets

TRANSPARENT SUBSTRATE, FLEXIBLE DISPLAY SUBSTRATE AND ITS MANUFACTURING METHOD, AND DISPLAY DEVICE

CROSS-REFERENCE TO RELATED APPLICATION

This application claims priority to Chinese Patent Application No. 202010447831.9 filed on May 25, 2020, which is incorporated herein by reference in its entirety.

TECHNICAL FIELD

The present disclosure relates to the field of display technology, in particular to a transparent substrate, a flexible display substrate and its manufacturing method, and a display device.

BACKGROUND

Along with the development of the display technology and the change in user requirements, a display panel which is bent locally has become a development trend. Usually, during the manufacture of a conventional flexible display panel, a via-hole is formed in a flexible base substrate at a position corresponding to a bending region, so as to be adapted to a subsequent bending operation. However, in this way, a material residual may probably occur at a region where the via-hole is formed, and thereby the reliability of the display panel may be adversely affected.

SUMMARY

In a first aspect, the present disclosure provides in some embodiments a transparent substrate which serves as a support substrate for manufacturing a flexible display substrate. The transparent substrate is provided with a first surface for supporting the flexible display substrate, and a protrusion made of a transparent material is formed on the first surface.

In some possible embodiments of the present disclosure, a distance between a side of the protrusion away from the first surface and the first surface is substantially equal to a thickness of a flexible base substrate of the flexible display substrate.

In some possible embodiments of the present disclosure, the transparent material of the protrusion has a high transmittance to laser.

In some possible embodiments of the present disclosure, the transparent material of the protrusion is a material having a high transmittance to the laser at a wavelength of 308 nm.

In some possible embodiments of the present disclosure, the flexible base substrate is arranged on the transparent substrate at a region other than the protrusion, and an orthogonal projection of the flexible base substrate onto the support substrate does not coincide with an orthogonal projection of the protrusion onto the support substrate.

In some possible embodiments of the present disclosure, an interlayer dielectric layer is arranged on the flexible base substrate of the transparent substrate, and an orthogonal projection of the interlayer dielectric layer onto the support substrate does not coincide with an orthogonal projection of the protrusion onto the support substrate.

In some possible embodiments of the present disclosure, a barrier layer is arranged on the flexible base substrate of the transparent substrate, and an orthogonal projection of the barrier layer onto the support substrate does not coincide with an orthogonal projection of the protrusion onto the support substrate.

In a second aspect, the present disclosure provides in some embodiments a method for manufacturing a flexible display substrate, including: providing a transparent substrate which severs as a support substrate for manufacturing the flexible display substrate, the transparent substrate being provided with a first surface for supporting the flexible display substrate, a protrusion made of a transparent material being formed on the first surface; forming a flexible base substrate on the first surface of the support substrate, the flexible base substrate being provided with a flat surface at a side away from the first surface, the flexible display substrate being provided with a bending region at a position corresponding to the protrusion; forming a driving circuitry and a light-emission unit at a side of the flexible base substrate away from the support substrate; and peeling the flexible display substrate off from the support substrate through a laser lift-off process.

In some possible embodiments of the present disclosure, the forming the flexible base substrate on the first surface of the support substrate includes forming the flat flexible base substrate continuous with the protrusion through a coating and baking process.

In some possible embodiments of the present disclosure, the forming the flat flexible base substrate continuous with the protrusion through a coating and baking process includes forming the flexible base substrate at a region other than the protrusion in such a manner that an orthogonal projection of the flexible base substrate onto the support substrate does not coincide with an orthogonal projection of the protrusion onto the support substrate.

In some possible embodiments of the present disclosure, the forming the driving circuitry and the light-emission unit at a side of the flexible base substrate away from the support substrate includes forming an opening extending in a direction perpendicular to the support substrate, an orthogonal projection of the opening onto the support substrate at least partially overlaps an orthogonal projection of the protrusion onto the support substrate, and the bending region of the flexible display substrate is formed at a region corresponding to the opening.

In some possible embodiments of the present disclosure, the forming the driving circuitry and the light-emission unit at a side of the flexible base substrate away from the support substrate includes: forming an interlayer dielectric layer on the flexible base substrate in such a manner that an orthogonal projection of the interlayer dielectric layer onto the support substrate does not coincide with an orthogonal projection of the protrusion onto the support substrate; and/or forming a barrier layer on the flexible base substrate in such a manner that an orthogonal projection of the barrier layer onto the support substrate does not coincide with an orthogonal projection of the protrusion onto the support substrate.

In some possible embodiments of the present disclosure, the peeling the flexible display substrate off from the support substrate through a laser lift-off process includes irradiating the flexible display substrate with laser at a side of the support substrate away from the first surface, so as to enable the flexible display substrate to be separated from the support substrate.

In some possible embodiments of the present disclosure, irradiation intensity of the laser at a region corresponding to the protrusion is substantially greater than irradiation intensity of the laser at a region other than the region corresponding to the protrusion.

In a third aspect, the present disclosure provides in some embodiments a flexible display substrate, including a flexible base substrate. The flexible display substrate is provided with a bending region and a non-bending region, and a thickness of a portion of the flexible base substrate at the bending region is substantially smaller than a thickness of a portion of the flexible base substrate at the non-bending region.

In some possible embodiments of the present disclosure, the portion of the flexible base substrate at the bending region is provided with a notch of a trapezoid shape.

In some possible embodiments of the present disclosure, the notch is of an inverted-isosceles trapezoid shape.

In some possible embodiments of the present disclosure, two vertex angles of the inverted-isosceles trapezoid are each of an arc-like shape.

In a fourth aspect, the present disclosure provides in some embodiments a display device including the above-mentioned flexible display substrate.

In some possible embodiments of the present disclosure, the display device includes a Liquid Crystal Display (LCD), a Light-Emitting Diode (LED) display, an Organic Light-Emitting Diode (OLED) display, a Quantum-dot Light-Emitting Diode (LED) display, or an Active Matrix Organic Light-Emitting Diode (AMOLED) display.

BRIEF DESCRIPTION OF THE DRAWINGS

In order to illustrate the technical solutions of the present disclosure in a clearer manner, the drawings desired for the present disclosure will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1:
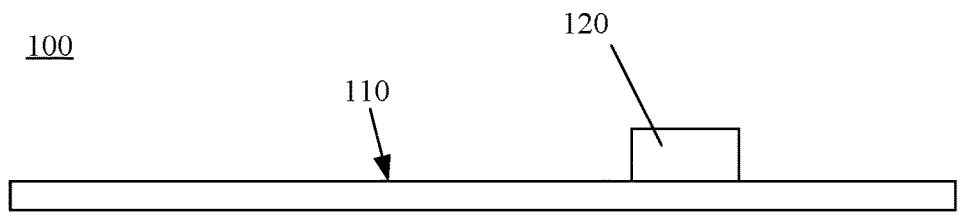
FIG. 1 is a schematic view showing a transparent substrate according to one embodiment of the present disclosure.

The present disclosure provides in some embodiments a transparent substrate 100 which serves as a support substrate for manufacturing a flexible display substrate. As shown in FIG. 1, the transparent substrate 100 is provided with a first surface 110 for supporting the flexible display substrate, and a protrusion 120 made of a transparent material is formed on the first surface 110.

For example, the protrusion 120 may be made of an organic or inorganic material, which may be the same as, or different from, a material of the transparent substrate 100. In some possible embodiments of the present disclosure, the protrusion 120 may be made of a transparent material having a high transmittance to laser. For example, the laser at a wavelength of 308 nm is used by a laser lift-off (LLO) process, so the protrusion 120 may be made of a material having a high transmittance to the laser at the wavelength of 308 nm.

The protrusion 120 may be arranged on the first surface 110 of the transparent substrate, i.e., a surface for supporting the flexible display substrate during the manufacture of the flexible display substrate. It should be appreciated that, during the manufacture of the flexible display substrate, generally speaking, it is necessary to form a flexible base substrate of the flexible display substrate, so as to adjust a shape of the flexible base substrate through the protrusion 120, which will be further described hereinafter in the embodiments involving a method for manufacturing the flexible display substrate.

According to the embodiments of the present disclosure, the transparent substrate may be provided with the protrusion, and during the manufacture of the flexible display substrate using the transparent substrate, it is able to adjust the shape of the flexible base substrate of the flexible display substrate through the protrusion, and reduce a thickness of a portion of the flexible base substrate at a bending region to be adapted to deformation in a bending procedure. As a result, it is unnecessary to provide any opening in the flexible base substrate, thereby to prevent the occurrence of a material residual, and improve the reliability of the flexible display substrate.

Figure 2:
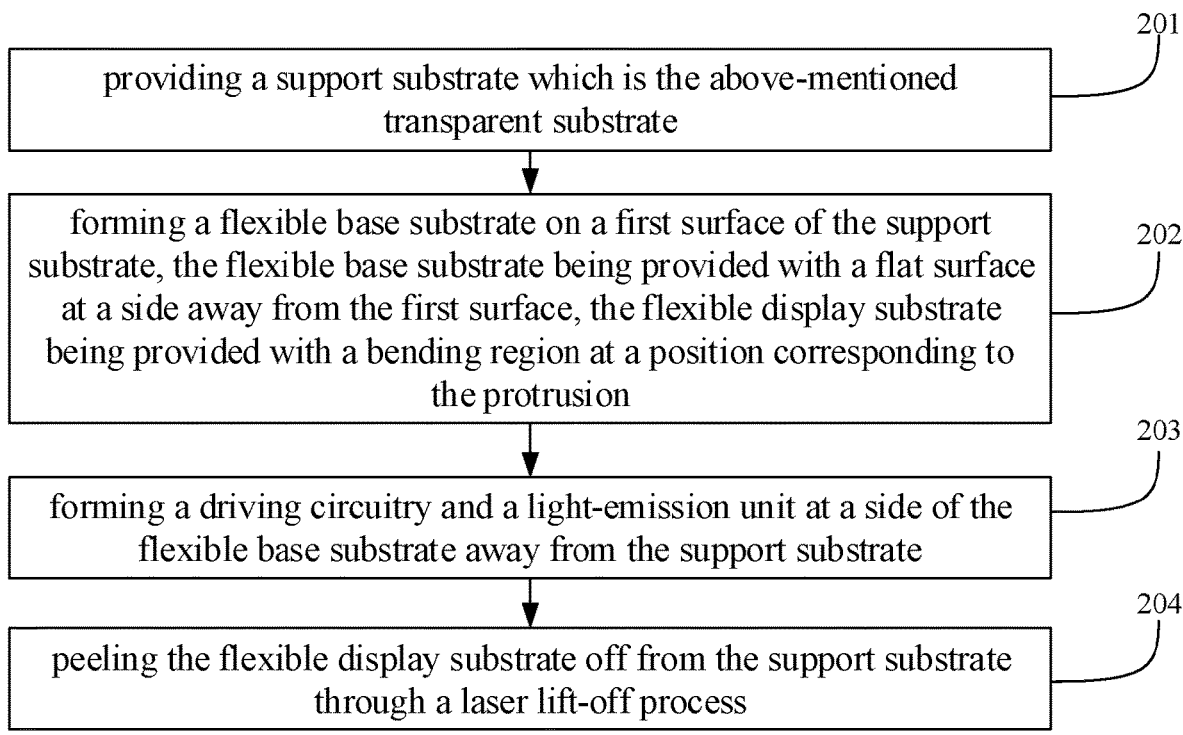
FIG. 2 is a flow chart of a method for manufacturing a flexible display substrate according to one embodiment of the present disclosure.

The present disclosure further provides in some embodiments a method for manufacturing a flexible display substrate which, as shown in FIG. 2, includes: Step 201 of providing a support substrate which is the above-mentioned transparent substrate; Step 202 of forming a flexible base substrate on a first surface of the support substrate, the flexible base substrate being provided with a flat surface at a side away from the first surface, the flexible display substrate being provided with a bending region at a position corresponding to the protrusion; Step 203 of forming a driving circuitry and a light-emission unit at a side of the flexible base substrate away from the support substrate; and Step 204 of peeling the flexible display substrate off from the support substrate through a laser lift-off process.

In the embodiments of the present disclosure, the support substrate may be the above-mentioned transparent substrate. During the implementation, the flexible display substrate may be formed on the first surface of the transparent substrate with the protrusion.

The protrusion may be arranged at a position corresponding to the bending region of the flexible display substrate. In other words, after the manufacture, the flexible display substrate may be bent at a position corresponding to the protrusion.

It should be appreciated that, in the embodiments of the present disclosure, during the manufacture, a shape of the flexible base substrate may change accordingly due to the protrusion, and the protrusion may occupy a certain space. Hence, during the manufacture of the flexible base substrate, a portion of the flexible base substrate corresponding to the protrusion may be removed to some extent, so as to facilitate a subsequent bending operation at the bending region.

It should be appreciated that, different from the related art, in the embodiments of the present disclosure, it is unnecessary to provide any opening in the flexible base substrate at a position corresponding to the bending region. Hence, in the related art, uncontrollable deformation may easily occur at an edge of the opening, and a residual may easily occur at the edge of the opening in a subsequent process, thereby the reliability of the flexible display substrate may be adversely affected. However, in the embodiments of the present disclosure, a thickness of the flexible base substrate may be adjusted at the bending region without any necessity to provide the opening, so it is able to prevent the uncontrollable deformation at the bending region due to the opening, thereby to reduce the probability of the material residual.

Due to the protrusion, a thickness of a portion of the flexible base substrate at a region corresponding to the protrusion may be smaller than a thickness of a portion of the flexible base substrate at the other region, so as to be adapted to a bending operation for the flexible display substrate, thereby to further improve the reliability of the flexible display substrate.

After the manufacture, the driving circuitry and the light-emission unit may be formed on the flexible base substrate through any known process, which will not be particularly defined herein.

Finally, the flexible display substrate may be peeled off through an LLO process. To be specific, the flexible display substrate may be irradiated with laser at a surface of the support substrate away from the flexible display substrate, so as to enable the flexible base substrate to be separated from the support substrate.

Figure 3A:
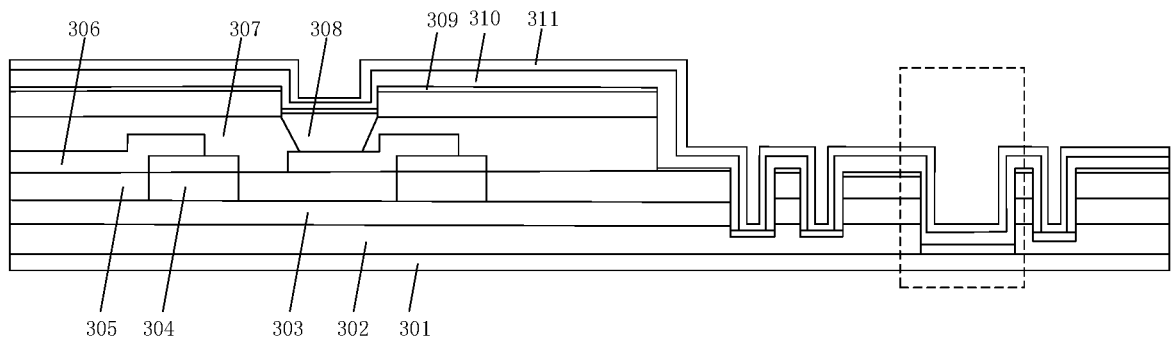
FIG. 3A is a schematic view showing a conventional flexible display substrate.
Figure 3B:
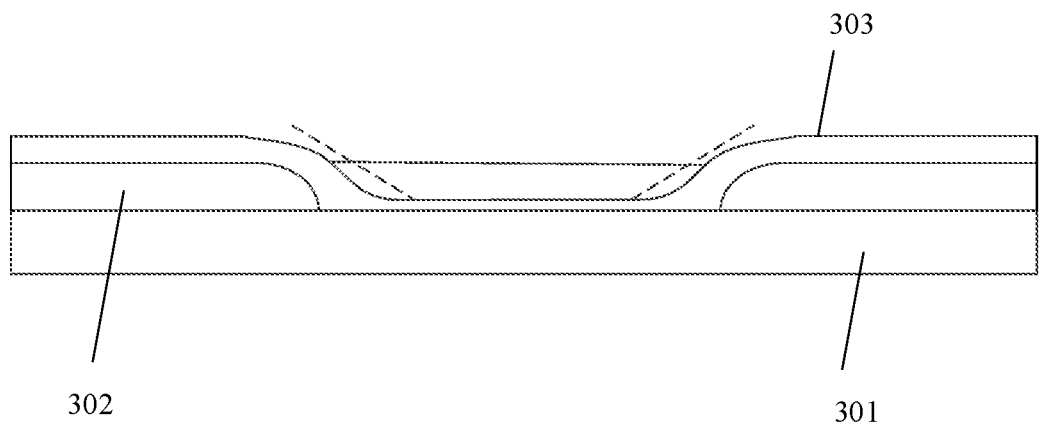
FIG. 3B is another schematic view showing the conventional flexible display substrate.
Figure 3C:
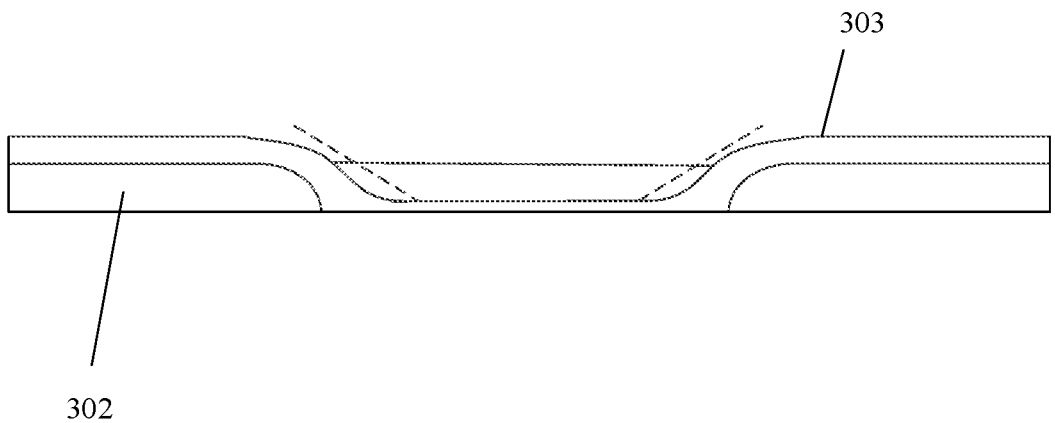
FIG. 3C is yet another schematic view showing the conventional flexible display substrate.

In the related art, as shown in FIG. 3A, a flexible display substrate is formed on a support substrate 301, and it mainly includes a flexible base substrate 302, a barrier layer 303, a light-shielding layer 304, an interlayer dielectric layer 305, a source/drain electrode 306, a planarization layer 307, an anode layer 308, a light-emission layer 309, a first packaging layer 310 and a second packaging layer 311. As shown by a dotted box in FIG. 3A in conjunction with FIG. 3B, it is necessary to form an opening passing through the flexible base substrate 302 at a bending region of the flexible display substrate. As shown in FIG. 3C, finally it is necessary to peel the flexible display substrate off from the support substrate 301.

Figure 4A:
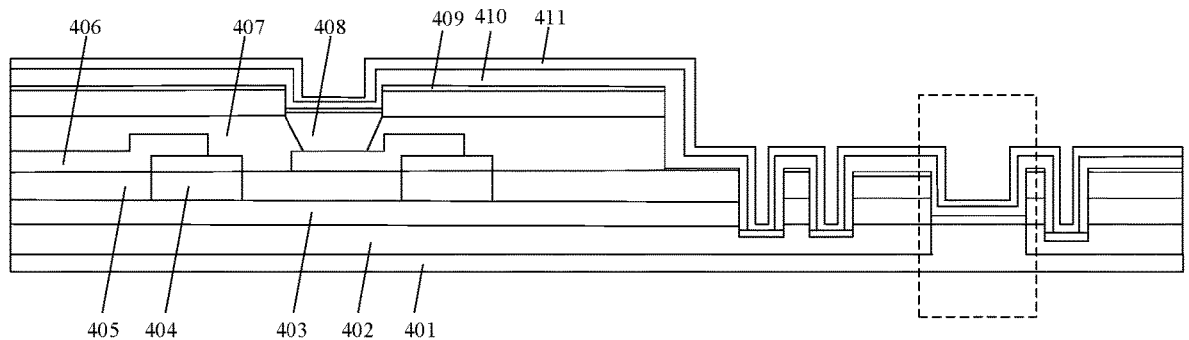
FIG. 4A is a schematic view showing the flexible display substrate according to one embodiment of the present disclosure.

As shown in FIG. 4A, in the embodiments of the present disclosure, the flexible display substrate is formed on a support substrate 401, and it mainly includes a flexible base substrate 402, a barrier layer 403, a light-shielding layer 404, an interlayer dielectric layer 405, a source/drain electrode 406, a planarization layer 407, an anode layer 408, a light-emission layer 409, a first packaging layer 410 and a second packaging layer 411.

Figure 4B:
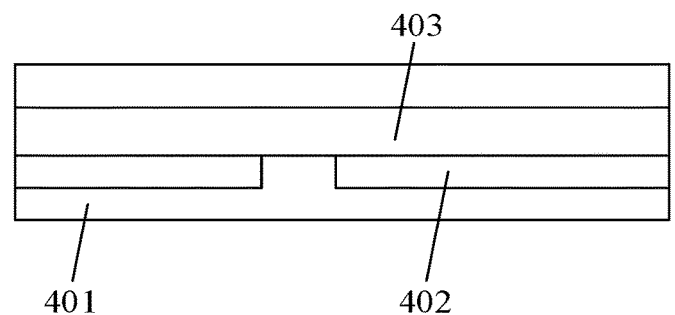
FIG. 4B is another schematic view showing the flexible display substrate according to one embodiment of the present disclosure.
Figure 4C:
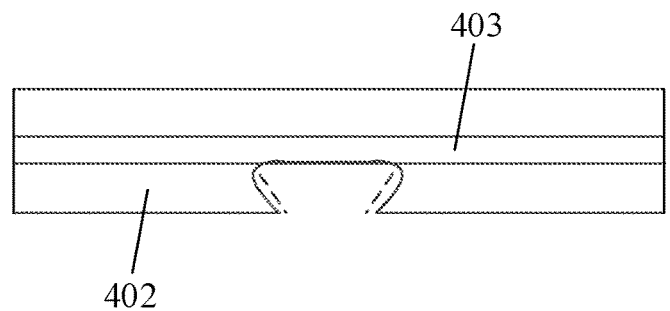
FIG. 4C is yet another schematic view showing the flexible display substrate according to one embodiment of the present disclosure.

The support substrate 401 may be the transparent substrate in FIG. 1. As shown by a dotted box in FIG. 4A in conjunction with FIG. 4B, it is unnecessary to provide any opening in the flexible base substrate 402. As shown in FIG. 4C, after the flexible display substrate has been peeled off from the support substrate 401, an opening may be formed at a position corresponding to a protrusion of the support substrate 401.

In some possible embodiments of the present disclosure, a portion of the flexible base substrate 402 at the bending region may be provided with a notch of a trapezoid shape.

In some possible embodiments of the present disclosure, as shown in FIG. 4C, the notch may be of an inverted-isosceles trapezoid shape.

In some possible embodiments of the present disclosure, as shown in FIG. 4C, two vertex angles of the inverted-isosceles trapezoid may be rounded to be of an arc-like shape.

In some possible embodiments of the present disclosure, in the flexible base substrate formed in Step 202, a distance between a side of the protrusion away from the first surface and the first surface may be substantially equal to a thickness of a flexible base substrate.

During the implementation, Step 202 may specifically include forming the flat flexible base substrate continuous with the protrusion through a coating and baking process.

The coating and baking process is known in the art, and thus will not be particularly defined herein. As a main difference from the related art, in the embodiments of the present disclosure, the formed flexible base substrate may be flat and continuous with the protrusion. In other words, a side of the flexible base substrate away from the first surface and a side of the protrusion away from the first surface may form a continuous and flat surface.

Further, the subsequent step of forming the driving circuitry and the light-emission unit on the flexible base substrate may be performed on a flat surface, rather than a surface with an opening. In this regard, it is able to facilitate the subsequent process, improve the product quality, prevent the occurrence of residuals of a metal material and the other material due to the opening, reduce the manufacture difficulty and provide a relative mature process, thereby to improve the reliability of the manufactured flexible display substrate.

In some possible embodiments of the present disclosure, the forming the flat flexible base substrate continuous with the protrusion through a coating and baking process may include forming the flexible base substrate at a region other than the protrusion in such a manner that an orthogonal projection of the flexible base substrate onto the support substrate does not coincide with an orthogonal projection of the protrusion onto the support substrate.

Actually, it is equivalent to forming an opening with a same shape as the protrusion in the flexible base substrate at a position corresponding to the protrusion. However, during the manufacture of the flexible display substrate, the flexible base substrate and the protrusion may form a flat surface, and during the subsequent formation of film layers, a portion corresponding to the protrusion may be formed on the protrusion rather than directly on the first surface of the support substrate. At this time, a difference in heights may be relatively small for these film layers, so it is able to improve the reliability of the driving circuitry and the light-emission unit.

In some possible embodiments of the present disclosure, the forming the driving circuitry and the light-emission unit at a side of the flexible base substrate away from the support substrate may include forming an opening extending in a direction perpendicular to the support substrate, an orthogonal projection of the opening onto the support substrate may at least partially overlap an orthogonal projection of the protrusion onto the support substrate, and the bending region of the flexible display substrate may be formed at a region corresponding to the opening.

As shown in FIG. 4A, during the formation of the driving circuitry and the light-emission unit, in order to be adapted to the bending region, the opening may be further formed at the bending region. Because the bending region is arranged at a position corresponding to the protrusion, the opening in the driving circuitry and the light-emission unit may also be provided at a position corresponding to the protrusion. In other words, the orthogonal projection of the opening in the driving circuitry and the light-emission unit onto the support substrate may at least partially overlap the orthogonal projection of the protrusion onto the support substrate, so as to enable the flexible display substrate to be deformed at the bending region accordingly.

In some possible embodiments of the present disclosure, the forming the driving circuitry and the light-emission unit at a side of the flexible base substrate away from the support substrate may include: forming an interlayer dielectric layer on the flexible base substrate in such a manner that an orthogonal projection of the interlayer dielectric layer onto the support substrate does not coincide with an orthogonal projection of the protrusion onto the support substrate; and/or forming a barrier layer on the flexible base substrate in such a manner that an orthogonal projection of the barrier layer onto the support substrate does not coincide with an orthogonal projection of the protrusion onto the support substrate.

In the embodiments of the present disclosure, to be specific, such film layers as the interlayer dielectric layer and/or the barrier layer may be formed through an exposure and etching process, so as to form the opening in the driving circuitry and the light-emission unit at a position corresponding to the bending region.

In some possible embodiments of the present disclosure, the peeling the flexible display substrate off from the support substrate through a laser lift-off process may include irradiating the flexible display substrate with laser at a side of the support substrate away from the first surface, so as to enable the flexible display substrate to be separated from the support substrate. Irradiation intensity of the laser at a region corresponding to the protrusion may be substantially greater than irradiation intensity of the laser at a region other than the region corresponding to the protrusion.

In the embodiments of the present disclosure, at the region other than the protrusion, a distance the laser needs to pass may be a thickness of the support substrate, and at the region where the protrusion is located, the distance the laser needs to pass may be a sum of the thickness of the support substrate and a thickness of the protrusion. At the region where the protrusion is located, there may exist a relatively large energy loss, so the irradiation intensity of the laser at the region where the protrusion is located may be increased to compensate for the energy loss due to the protrusion, so as to facilitate the separation of the flexible display substrate from the support substrate, thereby to improve a peeling effect of the flexible display substrate.

The present disclosure further provides in some embodiments a flexible display substrate manufactured through the above-mentioned method.

The flexible display substrate includes a flexible base substrate, and it is provided with a bending region and a non-bending region. A thickness of a portion of the flexible base substrate at the bending region is substantially smaller than a thickness of a portion of the flexible base substrate at the non-bending region.

The present disclosure further provides in some embodiments a display device including the above-mentioned flexible display substrate.

In the embodiments of the present disclosure, the display device may include various display devices, which include, but not limited to, an LCD, an LED display, an OLED display, a QLED display, and an AMOLED display.

The flexible display substrate is manufactured through the above-mentioned method, and the display device includes the flexible display substrate, so according to the display device in the embodiments of the present disclosure, it is able to at least achieve the above-mentioned technical effects, which will not be particularly defined herein.

In the above description, it should be appreciated that, such words as "in the middle of", "length", "on/above", "under/below", "front", "back", "left", "right", "vertical", "horizontal", "top", "bottom", "inside", "outside", "axial", "radial" and "circumferential" may be used to indicate directions or positions as viewed in the drawings, and they are merely used to facilitate the description in the present disclosure, rather than to indicate or imply that a device or member must be arranged or operated at a specific position.

In addition, such words as "first" and "second" are merely used to differentiate different components rather than to represent any order, number or importance, i.e., they are used to implicitly or explicitly indicate that there is at least one component. Further, such a phrase as "a plurality of" is used to indicate that there are at least two, e.g., two or more, components, unless otherwise specified.

Unless otherwise specified, such words as "install", "connect" and "secure" may have a general meaning, e.g., fixed connection, removable connection or integral connection, or mechanical or electrical connection, or direct connection or indirect connection via an intermediate component, or communication between two components. The meanings of these words may be understood by a person skilled in the art according to the practical need.

Unless otherwise defined, when one member is arranged on or under another member, the member may be in contact with the other member directly or via an intermediate member. In addition, when one member is arranged on/above another member, the member may be arranged right on/above the other member or not, or it merely means that the member is located at a level higher than the other member. When one member is arranged under/below another member, the member may be arranged right under/below the other member or not, or it merely means that the member is located at a level lower than the other member.

It should be further appreciated that, such phrases as "one embodiment", "some embodiments", "examples" or "some examples" intend to indicate that the features, structures, materials or characteristics are contained in at least one embodiment or example of the present disclosure, rather than referring to a same embodiment or example. In addition, the features, structures, materials or characteristics may be combined in any embodiment or embodiments in an appropriate manner in the case of no conflict.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A transparent substrate, which serves as a support substrate for manufacturing a flexible display substrate, wherein the transparent substrate is provided with a first surface for supporting the flexible display substrate, and a protrusion made of a transparent material is formed on the first surface;
   a distance between a side of the protrusion away from the first surface and the first surface is substantially equal to a thickness of a flexible base substrate of the flexible display substrate; and
   the flexible base substrate is arranged on the transparent substrate at a region other than the protrusion, and an orthogonal projection of the flexible base substrate onto the support substrate does not coincide with an orthogonal projection of the protrusion onto the support substrate.

2. The transparent substrate according to claim 1, wherein the transparent material of the protrusion is a material having a high transmittance to the laser at a wavelength of 308 nm.

3. The transparent substrate according to claim 1, wherein an interlayer dielectric layer is arranged on the flexible base substrate of the transparent substrate, and an orthogonal projection of the interlayer dielectric layer onto the support substrate does not coincide with an orthogonal projection of the protrusion onto the support substrate.

4. The transparent substrate according to claim 1, wherein a barrier layer is arranged on the flexible base substrate of the transparent substrate, and an orthogonal projection of the barrier layer onto the support substrate does not coincide with an orthogonal projection of the protrusion onto the support substrate.

5. A method for manufacturing a flexible display substrate, comprising:
   providing a transparent substrate which severs as a support substrate for manufacturing the flexible display substrate, the transparent substrate being provided with a first surface for supporting the flexible display substrate, a protrusion made of a transparent material being formed on the first surface;
   forming a flexible base substrate on the first surface of the support substrate, the flexible base substrate being provided with a flat surface at a side away from the first surface, the flexible display substrate being provided with a bending region at a position corresponding to the protrusion;
   forming a driving circuitry and a light-emission unit at a side of the flexible base substrate away from the support substrate; and
   peeling the flexible display substrate off from the support substrate through a laser lift-off process;
   wherein the forming the flexible base substrate on the first surface of the support substrate comprises:
   forming the flat flexible base substrate continuous with the protrusion through a coating and baking process; and
   the forming the flat flexible base substrate continuous with the protrusion through a coating and baking process comprises:
   forming the flexible base substrate at a region other than the protrusion in such a manner that an orthogonal projection of the flexible base substrate onto the support substrate does not coincide with an orthogonal projection of the protrusion onto the support substrate.

6. The method according to claim 5, wherein the forming the driving circuitry and the light-emission unit at a side of the flexible base substrate away from the support substrate comprises:
   forming an opening extending in a direction perpendicular to the support substrate, an orthogonal projection of the opening onto the support substrate at least partially overlaps an orthogonal projection of the protrusion onto the support substrate, and the bending region of the flexible display substrate is formed at a region corresponding to the opening.

7. The method according to claim 6, wherein the forming the driving circuitry and the light-emission unit at a side of the flexible base substrate away from the support substrate comprises:
   forming an interlayer dielectric layer on the flexible base substrate in such a manner that an orthogonal projection of the interlayer dielectric layer onto the support substrate does not coincide with an orthogonal projection of the protrusion onto the support substrate; and/or
   forming a barrier layer on the flexible base substrate in such a manner that an orthogonal projection of the barrier layer onto the support substrate does not coincide with an orthogonal projection of the protrusion onto the support substrate.

8. The method according to claim 5, wherein the peeling the flexible display substrate off from the support substrate through a laser lift-off process comprises:
   irradiating the flexible display substrate with laser at a side of the support substrate away from the first surface, so as to enable the flexible display substrate to be separated from the support substrate.

9. The method according to claim 8, wherein irradiation intensity of the laser at a region corresponding to the protrusion is greater than irradiation intensity of the laser at a region other than the region corresponding to the protrusion.

10. A flexible display substrate, comprising a flexible base substrate, wherein the flexible display substrate is provided with a bending region and a non-bending region, and a thickness of a portion of the flexible base substrate at the bending region is smaller than a thickness of a portion of the flexible base substrate at the non-bending region;
   wherein the portion of the flexible base substrate at the bending region is provided with a notch of a trapezoid shape;
   the notch is of an inverted-isosceles trapezoid shape; and
   two vertex angles of the inverted-isosceles trapezoid are rounded to be of an arc-like shape.

11. A display device, comprising the flexible display substrate according to claim 10.

12. The display device according to claim 11, wherein the display device comprises a Liquid Crystal Display (LCD), a Light-Emitting Diode (LED) display, an Organic Light-Emitting Diode (OLED) display, a Quantum-dot Light-Emitting Diode (QLED) display, or an Active Matrix Organic Light-Emitting Diode (AMOLED) display.

* * * * *